United States Patent
Fay (10) Patent No.: US 11,962,305 B2
(45) Date of Patent: Apr. 16, 2024

(54) RING OSCILLATOR BASED TRUE RANDOM NUMBER GENERATOR AND A METHOD FOR GENERATING A RANDOM NUMBER

(71) Applicant: NXP B.V., Eindhoven (NL)

(72) Inventor: Björn Fay, Brande-Hörnerkirchen (DE)

(73) Assignee: NXP B.V., Eindhoven (NL)

( * ) Notice: Subject to any disclaimer, the term of this patent is extended or adjusted under 35 U.S.C. 154(b) by 349 days.

(21) Appl. No.: 17/303,839

(22) Filed: Jun. 9, 2021

(65) Prior Publication Data

US 2022/0399883 A1  Dec. 15, 2022

(51) Int. Cl.
  *H03K 3/84* (2006.01)
  *G06F 7/58* (2006.01)
  *H03K 3/03* (2006.01)
  *H03K 21/08* (2006.01)

(52) U.S. Cl.
  CPC ........... *H03K 3/84* (2013.01); *G06F 7/58* (2013.01); *G06F 7/588* (2013.01); *H03K 3/0315* (2013.01); *H03K 21/08* (2013.01)

(58) Field of Classification Search
  CPC ...... G06F 7/58; G06F 7/588; H03K 3/840315
  USPC ........................ 708/250, 251, 255
  See application file for complete search history.

(56) References Cited

U.S. PATENT DOCUMENTS

| | | | |
|---|---|---|---|
| 8,260,835 B2 | 9/2012 | Fukushima et al. | |
| 2013/0346458 A1 | 12/2013 | Boehl | |
| 2016/0371059 A1* | 12/2016 | Riou | G06F 7/588 |
| 2018/0129476 A1* | 5/2018 | Wesson | G06F 7/582 |
| 2018/0267481 A1* | 9/2018 | Kondo | G01S 7/4865 |

FOREIGN PATENT DOCUMENTS

| | | | | |
|---|---|---|---|---|
| DE | 102010026688 A1 | | 1/2012 | |
| EP | 1518164 B1 * | | 2/2008 | G06F 7/588 |

OTHER PUBLICATIONS

Allini, Noumon et al.; "Evaluation and Monitoring of Free Running Oscillators Serving as Source of Randomness"; IACR Transactions on Cryptographic Hardware and Embedded Systems I, IACR 2018(3), vol. 2018, Issue 3; https://doi.org/10.13154/tches.v2018.i3.214-242.

Choi, P. et al.; "Fast Compact True Random Number Generator Based on Multiple Sampling"; The Institution of Engineering and Technology, Electronics Letters; First published Jun. 1, 2017; https://doi.org/10.1049/el.2017.1202.

(Continued)

*Primary Examiner* — Emily E Larocque
(74) *Attorney, Agent, or Firm* — Daniel D. Hill (57) ABSTRACT

A true random number generator circuit includes a ring oscillator and a plurality of sampling circuits. The ring oscillator includes a plurality of series-connected stages coupled together in a ring. An output of a last stage of the ring oscillator is coupled to an input of a first stage of the ring oscillator. A sampling circuit of the plurality of sampling circuits has an input coupled to a node located between two adjacent stages of the plurality of series-connected stages. Every node of the ring oscillator is coupled to a corresponding sampling circuit of the plurality of sampling circuits. In another embodiment, a method for generating a random number is provided.

17 Claims, 7 Drawing Sheets

(56) References Cited

OTHER PUBLICATIONS

Danger, Jean-Luc et al.; "Fast True Random Generator in FPGAs"; 2007 IEEE Northeast Workshop on Circuits and Systems; Aug. 5-8, 2007, Montreal, QC, Canada; DOI: 10.1109/NEWCAS.2007.4487970.

Mei, Faqiang, et al.; "A Highly Flexible Lightweight and High Speed True Random Number Generator on FPGA"; IEEE Computer Society Annual Symposium on VLSI (ISVLSI); Jul. 8-11, 2018, Hong Kong, China; DOI: 10.1109/ISVLSI.2018.00079.

Mendes, Pedro Miguel Nunes; "Random Number Generator Based on Ring Oscillators for IoT Applications"; NOVA University Lisbon, Portugal; Sep. 2017.

Robson, Stewart; "A Ring Oscillator Based Truly Random Number Generator"; A theses presented to the University of Waterloo in fulfillment of the thesis requirement for the degree of Master of Applied Science in Electrical and Computer Engineering; Waterloo, Ontario, Canada; 2013.

Rozic, Vladimir et al.; "Highly Efficient Entropy Extraction for True Random Number Generators on FPGAs"; 2015 52nd ACM/EDAC/IEEE Design Automation Conference (DAC); Jun. 8-12, 2015, San Francisco, California; DOI: 10.1145/2744769.2744852.

Vasyltsov, Ihor et al.; "Fast Digital TRNG Based on Metastable Ring Oscillator"; Cryptographic Hardware and Embedded Systems (CHES), 10th International Workshop; Aug. 10-13, 2008, Washington, D.C.; DOI:10.1007/978-3-540-85053-3_11.

Brar, Keerat et al., "True Random No. Generators"; Dec. 19, 2007; Course "Cryptography and Computer Network-Security" ECE646, Fall 2007, pp. 1-5, George Mason University, Fairfax, VA.

Gong, Lishuang et al., "True Random No. Generators Using Electrical Noise"; IEEE Access, vol. 7; pp. 125796-125805; Published Sep. 2, 2019; DOI: 10.1109/ACCESS.2019.2939027.

* cited by examiner

FIG. 7

RING OSCILLATOR BASED TRUE RANDOM NUMBER GENERATOR AND A METHOD FOR GENERATING A RANDOM NUMBER

BACKGROUND

Field

This disclosure relates generally to random number generators, and more particularly, to a ring oscillator based true random number generator (TRNG) and method for generating a random number.

Related Art

Some cryptographic algorithms require random number generators with some entropy. Most often a cryptographic device will have some kind of noise/entropy source that is used to construct, for example, a true random number generator (TRNG). A TRNG can be distinguished from a deterministic random number generator (DRNG). For example, a DRNG only gets seeded with some entropy and then runs an algorithm to generate a stream of numbers that look random. Whereas a TRNG does not use a deterministic algorithm. The quality of TRNGs and DRNGs as well as the security of DRNGs can be from very low to very high.

Jitter from a ring oscillator (RO) can be used as an entropy source for a TRNG. In a typical ring oscillator-based entropy source, an output of the ring oscillator is sampled to extract the entropy. A ring oscillator approach to entropy can be relatively slow compared to other approaches of generating entropy. However, an RO is relatively simple and is mainly constructed using digital inverters and logic gates instead of analog circuits.

Therefore, what is needed is a ring oscillator based TRNG that is faster while providing at least the same amount of entropy.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a ring oscillator based TRNG that samples a complete RO-state. Sampling a complete RO-state means sampling a logical signal after each inverter or other logic gate of the RO. In one embodiment, the complete RO-state may be relatively large, that is, about 9-21 bits compared to the entropy provided, which may be 1 or 2 bits. In one embodiment a state-compression may be provided that allows an output size, for example, 3-bits, that is only slightly larger than the contained entropy in the bits. The use of compression still allows the computation of differences and offsets. Also, in another embodiment, a second RO may be used for triggering the sampling, instead of using a system clock for the triggering. In addition, a means may be provided for handling meta-stability in the sampling process.

By sampling a complete RO-state, a RO based TRNG is provided that is faster than an RO based TRNG that only samples one output state of the RO.

In accordance with an embodiment, there is provided, a random number generator circuit including: a first ring oscillator having a plurality of series-connected stages coupled together in a ring, wherein an output of a last stage of the first ring oscillator is coupled to an input of a first stage of the first ring oscillator; and a plurality of sampling circuits, a sampling circuit of the plurality of sampling circuits having an input coupled to a node located between two adjacent stages of the plurality of series-connected stages wherein every node of the first ring oscillator is coupled to a corresponding sampling circuit of the plurality of sampling circuits. The random number generator circuit may further include a synchronization circuit coupled to an output of each of the plurality of sampling circuits. The synchronization circuit may include: a first flip-flop having an input, a clock input, and an output; a second flip-flop having an input coupled to the output of the first flip-flop, a clock input, and an output; and a logic gate having an input coupled to the output of the second flip-flop. The synchronization circuit may include: a NOR logic gate having a first input coupled to the node between two adjacent stages, a second input coupled to receive a first clock signal, and an output; an OR logic gate having a first input coupled to the output of the NOR logic gate, a second input coupled to receive a second clock signal, and an output; a first NAND logic gate having a first input coupled to the node between two adjacent stages, a second input coupled to receive the first clock signal, and an output; a second NAND logic gate having a first input coupled to the output of the first NAND logic gate, a second input coupled to receive the second clock signal, and an output; a first counter having an input coupled to the output of the OR logic gate, and an output; and a second counter having an input coupled to the output of the second NAND logic gate, and an output. Each of the plurality of series-connected stages may include an inversion. The random number generator circuit may further include a compression circuit for decreasing a number of outputs of the random number generator. The random number generator circuit may further include: a second ring oscillator having an output; and a counter having an input coupled to the output of the second ring oscillator, and an output, wherein the second ring oscillator and the counter are for providing a sampling pulse for controlling sampling of the first ring oscillator using the plurality of sampling circuits. The random number generator circuit may further include: a first shift register having an input coupled to an output of the first ring oscillator for receiving a first sample, and an output; a second shift register having an input coupled to the output of the first shift register for receiving a second sample, the second sample previous in time to the first sample, and an output; and a difference computation circuit having a first input coupled to the output of the first shift register and a second input coupled to the output of the second shift register, and an output for providing a sample difference between the first and second samples.

In another embodiment, there is provided, a random number generator circuit including: a first ring oscillator having a plurality of series-connected stages coupled together in a ring, wherein an output of a last stage of the first ring oscillator is coupled to an input of a first stage of the first ring oscillator; a plurality of sampling circuits, a sampling circuit of the plurality of sampling circuits having an input coupled to a node located between two adjacent stages of the plurality of series-connected stages, wherein every node of the first ring oscillator is coupled to a corresponding sampling circuit of the plurality of sampling circuits; and a synchronization circuit coupled to an output of each of the plurality of sampling circuits. The synchronization circuit may include: a first flip-flop having an input, a clock input, and an output; a second flip-flop having an input coupled to the output of the first flip-flop, a clock input, and an output; and a logic gate having an input coupled to the output of the second flip-flop. The synchronization circuit may include: a NOR logic gate having a first input coupled to the node between two adjacent stages, a second input coupled to receive a first clock signal, and an output; an OR logic gate having a first input coupled to the output of the NOR logic gate, a second input coupled to receive a second clock signal, and an output; a first NAND logic gate having a first input coupled to the node between two adjacent stages, a second input coupled to receive the first clock signal, and an output; a second NAND logic gate having a first input coupled to the output of the first NAND logic gate, a second input coupled to receive the second clock signal, and an output; a first counter having an input coupled to the output of the OR logic gate, and an output; and a second counter having an input coupled to the output of the second NAND logic gate, and an output. Each of the plurality of series-connected stages may include an inversion. The random number generator circuit may further include a compression circuit for decreasing a number of outputs of the random number generator. The random number generator circuit may further include: a second ring oscillator having an output; and a counter having an input coupled to the output of the second ring oscillator, and an output, wherein the second ring oscillator and the counter for providing a sampling pulse for controlling sampling of the first ring oscillator using the plurality of sampling circuits. The random number generator circuit may further include: a first shift register having an input coupled to an output of the first ring oscillator for receiving a first sample, and an output; a second shift register having an input coupled to the output of the first shift register for receiving a second sample, the second sample previous in time to the first sample, and an output; and a difference computation circuit having a first input coupled to the output of the first shift register and a second input coupled to the output of the second shift register, and an output for providing a sample difference between the first and second samples.

In yet another embodiment, there is provided, a method for generating a random number including: providing a first ring oscillator having a plurality of series-connected stages coupled together in a ring, wherein an output of a last stage of the first ring oscillator is coupled to an input of a first stage of the ring oscillator; and sampling, using a plurality of sampling circuits, output signals from the ring oscillator, wherein a sampling circuit of the plurality of sampling circuits having an input coupled to a node located between two adjacent stages of the plurality of series-connected stages, wherein every node of the first ring oscillator is coupled to a corresponding sampling circuit of the plurality of sampling circuits. The method may further include synchronizing the output signals using a synchronization circuit coupled to an output of each of the plurality of sampling circuits. Each of the plurality of series-connected stages of the first ring oscillator may include an inversion. The method may further include compressing the output signals from a first number of output signals to a second number of output signals using a compression circuit. Sampling, using a sampling circuit, may further include the sampling circuit including: a second ring oscillator having an output; and a counter having an input coupled to the output of the second ring oscillator, and an output, wherein the second ring oscillator and the counter for providing a sampling pulse for controlling sampling of the first ring oscillator using the plurality of sampling circuits.

Figure 1:
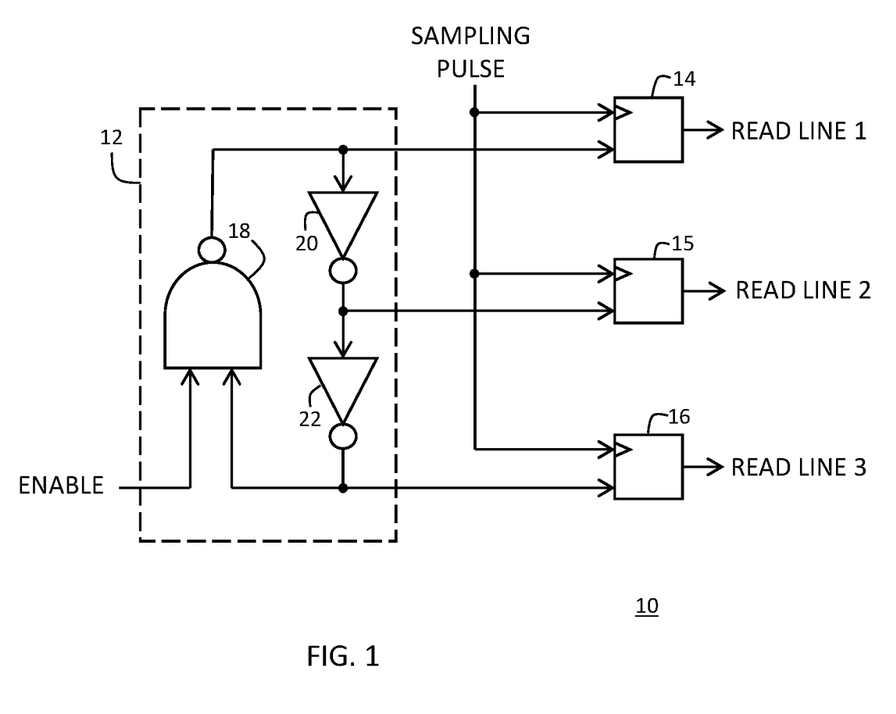
FIG. 1 illustrates a ring oscillator based TRNG with complete state sampling in accordance with an embodiment.

FIG. 1 illustrates RO based TRNG 10 in accordance with an embodiment. Ring oscillator based TRNG 10 includes RO 12 and sampling flip-flops 14-16. Ring oscillator 12 includes NAND logic gate 18 and inverters 20 and 22. For simplicity, RO 12 only includes three stages, inverters 20 and 22 and NAND logic gate 18. Another embodiment may include more stages. NAND logic gate 18 receives an enable signal (ENABLE) used to start and stop RO 12. In a circuit implementation, the connections between each logic gate in RO 12 should have the same length to provide the same delay between stages. In one embodiment, RO based TRNG may be implemented in an integrated circuit. Each of sampling flip-flops 14-16 are connected between each of the stages. For example, sampling flip-flop 14 is connected to a node between the output of NAND logic gate 18 and the input of inverter 20. Sampling flip-flop 15 is connected to a node between the output of inverter 20 and the input of inverter 22. Sampling flip-flop 16 is connected to a node between the output of inverter 22 and an input of NAND logic gate 18. Sampling flip-flops 14-16 are triggered by a sampling pulse labeled "SAMPLING PULSE" that may be generated from a system clock. Sampling flip-flops 14-16 store the state of RO 12. The sampled state of RO 12 is read via read lines READ LINE 1-READ LINE 3. In a circuit layout of RO based TRNG 10, the sampling pulse lines, or conductors, and the lines connecting sampling flip-flops 14-16 should also be close to the same length. The length of the connections between the stages is not as important. A mismatch between line lengths would generate more bias in the sample and may therefore need to be longer to accumulate the needed entropy. For the other lines, the line length requirement can be relaxed a little by providing offsetting time delays per sampling flip-flop. This would trigger the flip-flops at different times to ensure the signal is sampled at the same time as the other flip-flops.

In general, for an n-stage RO, there are usually 2n states. For the 3-stage RO 12, there are 6 different states: 101, 001, 011, 010, 110, and 100 (in this order). Due to meta-stability or other sampling errors, the two other possible remaining states might occur. This may not be a problem if the other two states can be ignored, skipped, or handled by post-processing. Instead of using an RO with inverters, an RO made up of buffers and a NAND gate may be used. Using buffers with a NAND logic gate would also produce six states: 111, 011, 001, 000, 100, and 110. Also, some other gates or mixes of gate types are possible. For higher efficiency, the gates used should be as balanced as possible, meaning each state should have substantially the same probability of being produced. There may be other constructions with more complex gates and feedback structure that only have n states or even more than 2n states.

Figure 3:
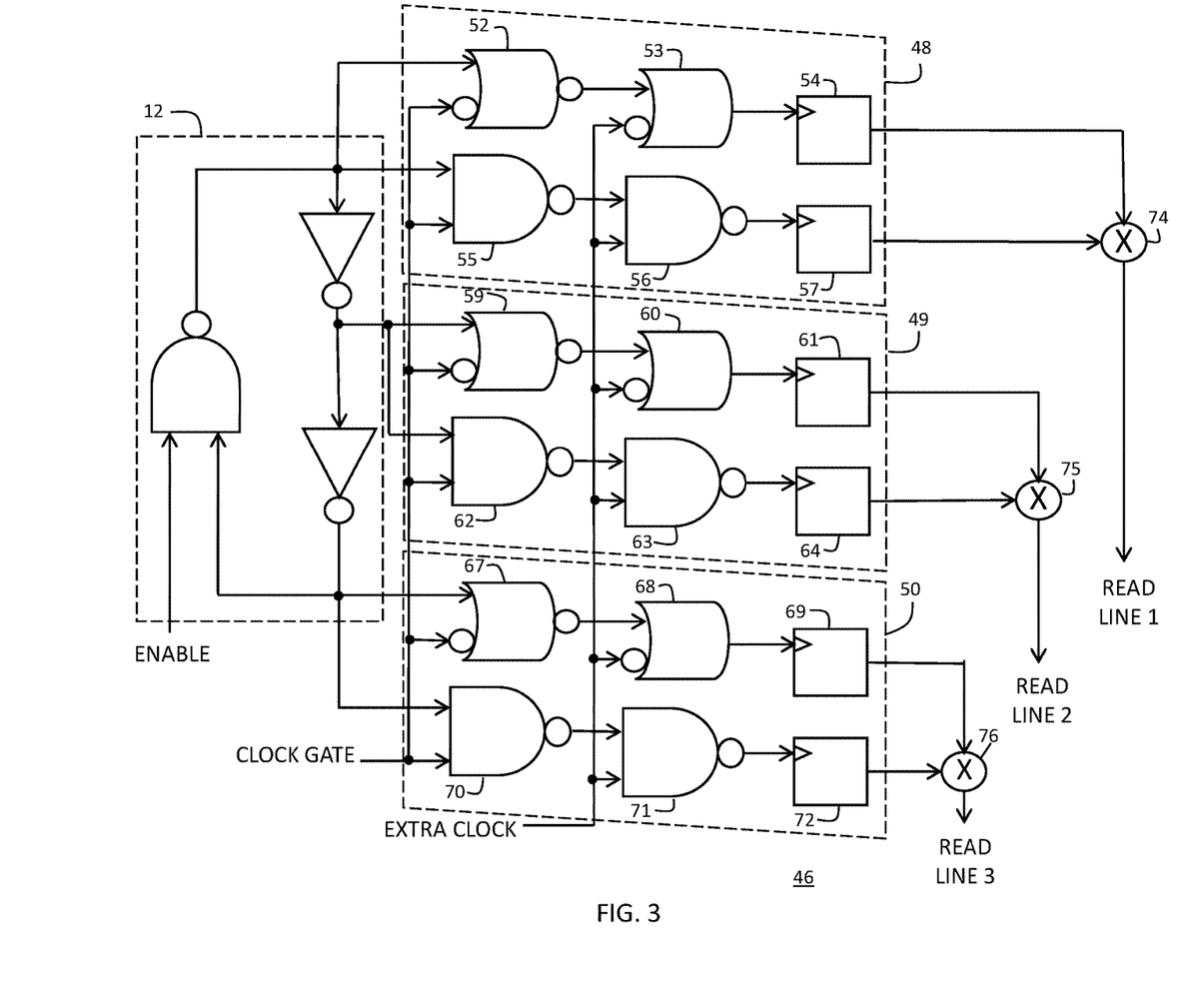
FIG. 3 illustrates a ring oscillator based TRNG with synchronization and compression according to another embodiment.

In practice, a 3-stage RO may be too fast to generate a stable signal. An RO with more stages may be more practical. For an inverter-based RO, an odd number of stages is necessary. For other constructions using different logic gates, an even number of stages may be possible. Because the sampled state gets larger for more stages, post processing and health testing becomes more complex. However, it may be necessary to wait for the sampling to accumulate enough jitter which is roughly given as one stage/gate/state. It may be desirable to compress the possible states to only a few states. As an example, compression is illustrated in FIG. 3. Compression can be done by XORing every k-th state bit together where k is a divisor of n. It would in principle also work for other values of k, but then some resolution may be lost at the cycle-wrapping. The resolution may be reduced because of the offset provided, meaning that the offset to the last state that gives the same compressed state would be smaller than k. The reason this works is because no matter what type of RO is used, state-changes will toggle the state bits in order and if every k bit is XORed, the compressed bits will toggle in order, so the compressed state behaves similarly to a full state of a k stage RO. For example, an XOR compressed state of a 9-stage inverter-based RO will behave as a 3-stage inverter-based RO, delivering 6 different states instead of 18 (excluding sampling errors).

Figure 2:
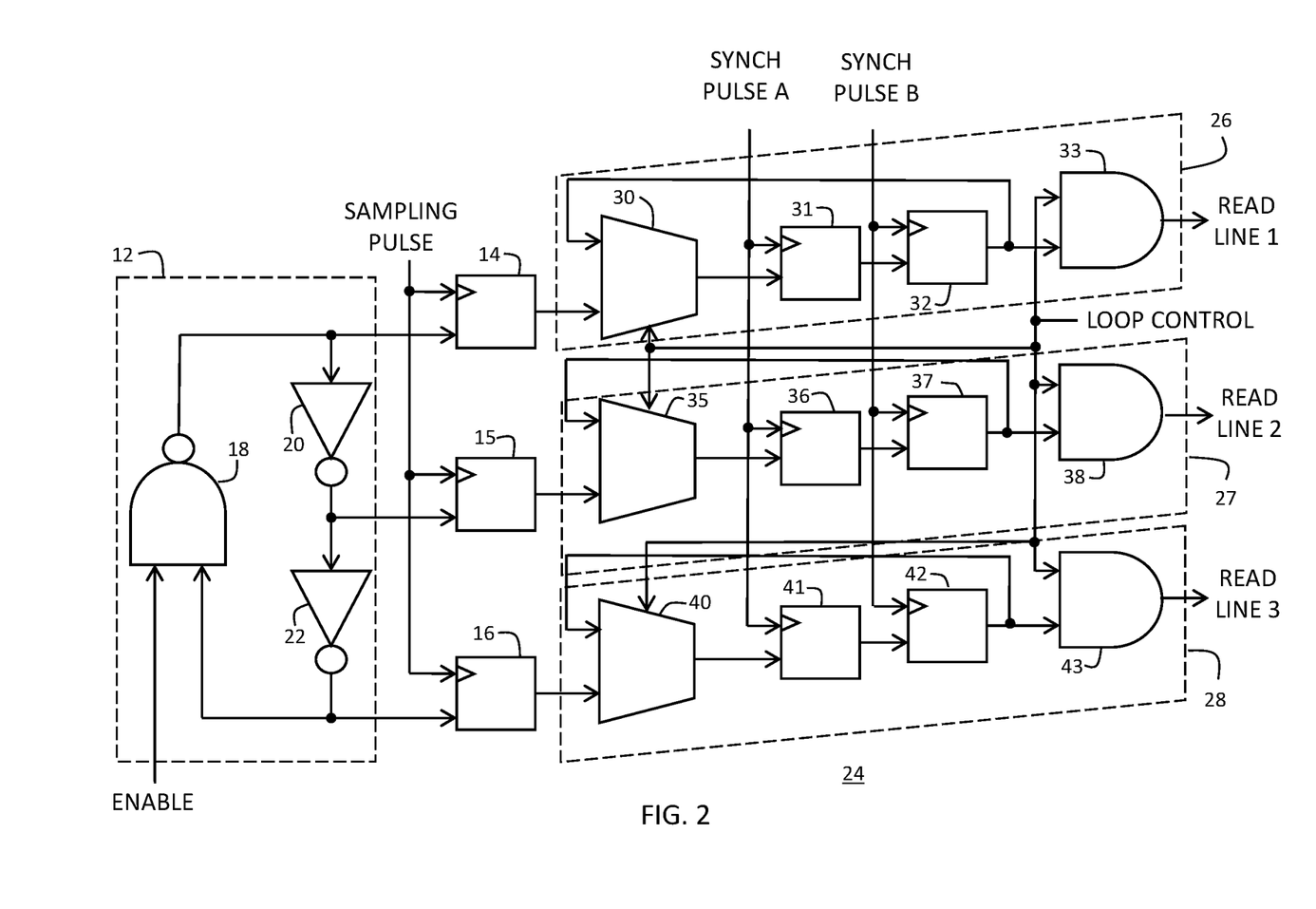
FIG. 2 illustrates a ring oscillator based TRNG with synchronization in accordance with an embodiment.

FIG. 2 illustrates RO based TRNG with synchronization 24 in accordance with an embodiment. RO based TRNG with synchronization 24 builds on RO based TRNG 10 from FIG. 1. RO based TRNG with synchronization 24 includes synchronization circuits 26, 27, and 28. Synchronization circuit 26 includes multiplexer 30, flip-flops 31 and 32, and AND logic gate 33. Synchronization circuit 27 includes multiplexer 35, flip-flops 36 and 37, and AND logic gate 38. Synchronization circuit 28 includes multiplexer 40, flip-flops 41 and 42, and AND logic gate 43. Each of the synchronization circuits includes a feedback path connected between an output of the second flip-flop to an input of the multiplexer.

Asynchronous events can cause metastable states to occur in a synchronous system having bistable circuits, such as RO based TRNG 10 of FIG. 1. For example, sampling might happen at a time that causes one or more of the flip-flops 14-16 to become metastable. To overcome this problem, synchronization circuits 26-28 receive signals from RO 12 that may be asynchronous to the flip-flops of the synchronization circuits, where the flip-flops are clocked by SYNC PULSE A and SYNC PULSE B to settle the metastability. In another embodiment, more than two synchronization flip-flops may be used in each synchronization loop. Also, the probability of settling the metastability may be increased by increasing a delay time between the sampling pulse and the two synchronization pulses SYNC PULSE A and SYNC PULSE B. Multiplexers 30, 35, and 40 and AND logic gates 33, 38, and 43 are controlled with a timing signal labeled "LOOP CONTROL." After triggering the sampling pulse, clock signals SYNC PULSE A and SYNC PULSE B are alternately triggered until metastability is gone. During this time, timing signal LOOP CONTROL is a logic zero such that AND logic gates 33, 38, and 43 are "locked", meaning that their outputs do not toggle. Between assertions of the sampling pulse and SYNC PULSE A, multiplexers 30, 35, and 40 pass the signal from sampling flip-flops 14, 15, and 16 to the corresponding flip-flops 31, 36, and 41, respectively. Then, multiplexers 30, 35, and 40 are switched to the feedback path. After sufficient synchronizing loops are complete, AND logic gates 33, 38, and 43 are opened by switching LOOP CONTROL to a logic one so that the signal can pass to the read lines READ LINE 1, READ LINE 2, and READ LINE 3.

FIG. 3 illustrates RO based TRNG with synchronization and compression 46 according to another embodiment. RO based TRNG with synchronization and compression 46 includes ring oscillator 12, sampling rows 48, 49, and 50, and XOR logic gates 74-76. Sampling row 48 includes NOR logic gate 52, OR logic gate 53, NAND logic gates 55 and 56, and 1-bit counters 54 and 57. Sampling row 49 includes NOR logic gate 59, OR logic gate 60, NAND logic gates 62 and 63, and 1-bit counters 61 and 64. Sampling row 50 includes NOR logic gate 67, OR logic gate 68, NAND logic gates 70 and 71, and 1-bit counters 69 and 72. A compression portion of RO based TRNG with synchronization and compression 46 includes XOR logic gates 74-76. Note that the embodiment of FIG. 2 may also have a similar compression portion if more stages are added to RO 12.

Unlike RO based TRNG with synchronization 24, RO based TRNG with synchronization and compression 46 includes NAND logic gates that can block the RO signal from reaching 1-bit counters 54, 57, 61, 64, 69, and 72. Between the blocking NAND logic gates are extra NAND logic gates that may generate extra clock pulses to the 1-bit counters when the extra clock signal (EXTRA CLOCK) is toggled from 1 to 0 to 1 multiple times as needed. Because the NAND logic gates would always switch to a state that corresponds to a logic 0 if the clock gate signal goes from 1 to 0, only half of the states could be captured. To capture all the states, the sampling rows include duplicate portions that are constructed by replacing the NAND logic gates with NOR and OR logic gates, where one input of the NOR and OR logic gates is negated to get the same output behavior as the NAND sampling rows. Alternatively, the NAND logic gates could be replaced with OR and NAND logic gates. In this way, six counter bits for a 3-stage RO with inverters would acquire 101, 001, 011, 010, 110, and 100, which would be $$\begin{pmatrix} 0 & 0 & 0 \\ 0 & 0 & 0 \end{pmatrix}, \begin{pmatrix} 0 & 0 & 0 \\ 1 & 0 & 0 \end{pmatrix}, \begin{pmatrix} 0 & 1 & 0 \\ 1 & 0 & 0 \end{pmatrix}, \begin{pmatrix} 0 & 1 & 0 \\ 1 & 0 & 1 \end{pmatrix}, \begin{pmatrix} 1 & 1 & 0 \\ 1 & 0 & 1 \end{pmatrix}, \begin{pmatrix} 1 & 1 & 0 \\ 1 & 1 & 1 \end{pmatrix},$$

$$\begin{pmatrix} 1 & 1 & 1 \\ 1 & 1 & 1 \end{pmatrix}, \begin{pmatrix} 1 & 1 & 1 \\ 0 & 1 & 1 \end{pmatrix}, \begin{pmatrix} 1 & 0 & 1 \\ 0 & 1 & 1 \end{pmatrix}, \begin{pmatrix} 1 & 0 & 1 \\ 0 & 1 & 0 \end{pmatrix}, \begin{pmatrix} 0 & 0 & 1 \\ 0 & 1 & 0 \end{pmatrix}, \begin{pmatrix} 0 & 0 & 1 \\ 0 & 0 & 0 \end{pmatrix},$$

where one sampling row would count positive edges with the two NAND logic gates, and the other sampling row would count the negative edges with the NOR and OR logic gates. As can be seen, the bits toggle from left to right, but not in the same sampling row. Exclusive OR (XOR) gates 74, 75, and 76 form a compression circuit for reducing the number of outputs from the sampling rows 48, 49, and 50 from six to three. The outputs of counters 54 and 57 are provided as inputs to XOR gate 74. The outputs of counters 61 and 64 are provided as inputs to XOR gate 75. The outputs of counters 69 and 72 are provided as inputs to XOR gate 76. An output of each XOR gate 74, 75, and 76 is connected to a read line (READ LINE 1, READ LINE 2, AND READ LINE 3). If sampling rows 48, 49, and 50 are XORed as shown, the compressed counter states are 000, 100, 110, 111, 011, and 001. These states look different from the real RO states, but also provide a sequence of six states that can be used to compute differences. Any type of RO can be used. As mentioned above, the compression circuit in FIG. 3 may also be used in an embodiment of FIG. 2 that includes more output states.

Figure 4:
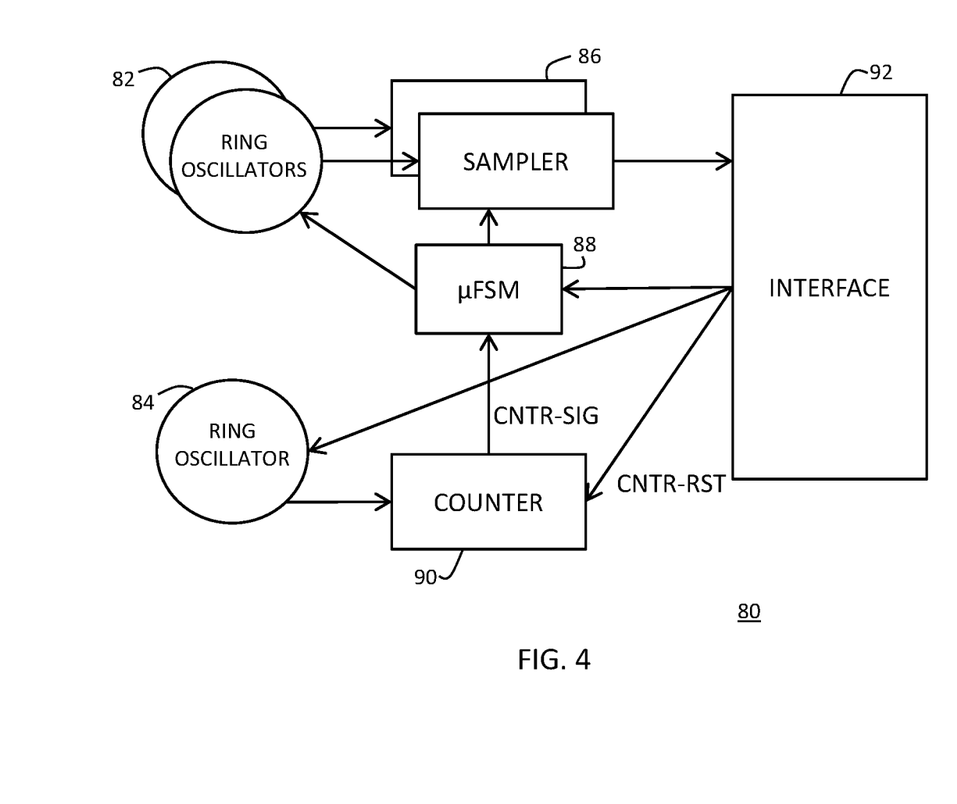
FIG. 4 illustrates a ring oscillator based TRNG using a second ring oscillator for generating a sampling pulse in accordance with an embodiment.

FIG. 4 illustrates RO based TRNG 80 using a second ring oscillator for generating a sampling pulse in accordance with an embodiment. TRNG 80 includes a plurality of ring oscillators 82, ring oscillator 84, a plurality of samplers 86, finite state machine (FSM) 88, counter 90, and interface 92. Instead of using one RO for creating the entropy, a plurality of ring oscillators 82 may be used as illustrated in FIG. 4. Ring oscillator 84 and counter 90 are used for generating a sampling pulse labeled CNTR-SIG. Counter 90 is reset using reset signal CNTR-RST after successful sampling and synchronization and before starting another iteration of sampling. Using second RO 84 and counter 90 for generating the sampling pulse is beneficial because second RO 84 is exposed to the same or similar external influences and hence would generate less noise. Second RO 84 does not have any specific layout requirements as described above for RO 12 (FIG. 1), except that the second RO should have a different conductor length and maybe have different logic gates to reduce the possibility of interlocking the two ROs. Also, it has been shown that sampling differences may be better than sampling direct values (see FIG. 6 for an example difference circuit). For even less autocorrelation, the difference should be computed from non-overlapping pairs. No matter how the sampling is performed, or the type of RO used, the compressed state/counter bits can be normalized by simply XORing with the sample value at time 0. Then the sequences 000 . . . 0, 100 . . . 0, 110 . . . 0, . . . , 111 . . . 1, 011 . . . 1, 001 . . . 1, . . . , 000 . . . 0 are provided.

Finite state machine 88 generates the sampling pulse and at least some of the needed signals for synchronization. Interface 92 is a user interface to allow a user the ability to interact with TRNG 80. For example, the user may be able to control configuration and set up, to start and stop TRNG 80, and to read the sampled output from TRNG 80. Note that in another embodiment, FIG. 4 may be implemented differently. For example, in another embodiment, more control may be given to FSM 88 than interface 92.

Figure 5:
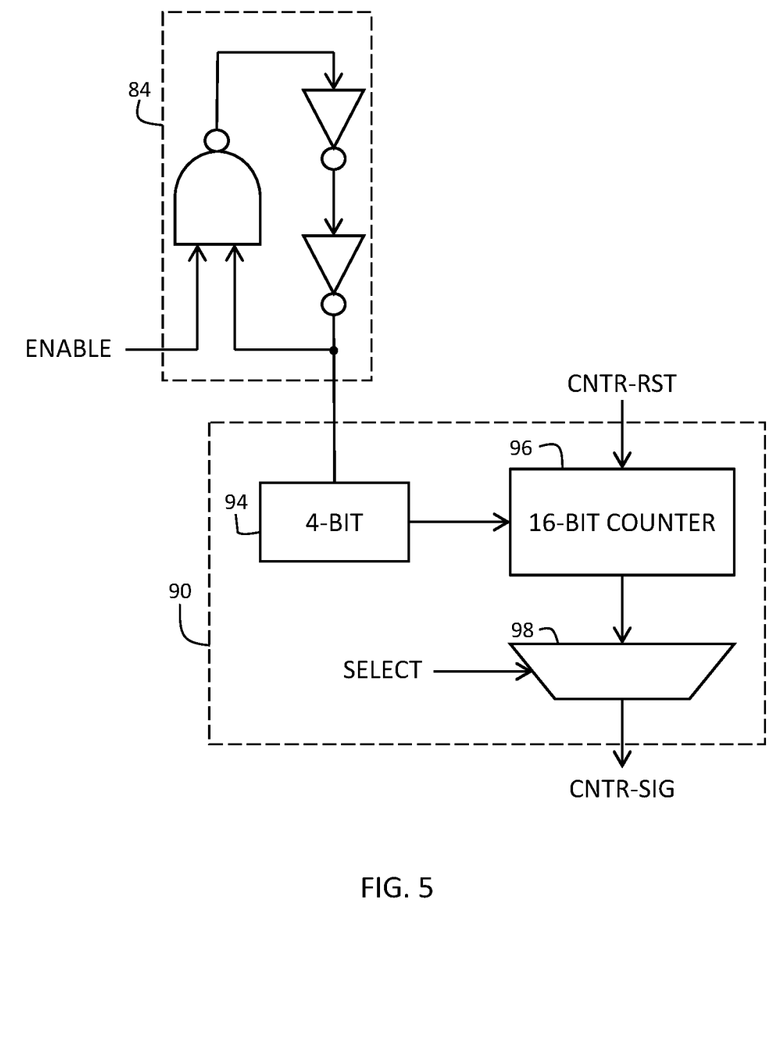
FIG. 5 illustrates an RO and a counter to generate the sampling pulse for the ring oscillator based TRNG of FIG. 4.

FIG. 5 illustrates RO 84 and counter 90 of the embodiment of FIG. 4 in more detail. Ring oscillator 84 is a conventional RO having 3 inverter stages as illustrated above. Counter 90 includes 4-bit counter 94, 16-bit counter 96, and multiplexer 98. Four-bit counter 94 is used for frequency division. Four-bit counter 94 may also be used to generate another clocking signal used by FSM 88 for synchronizing the sampling outputs for metastability. Multiplexer 98 selects one bit of 16-bit counter 96 to provide a sampling time as a power of 2. Sixteen-bit counter 94 could also have been implemented as a decrementing counter to set up an arbitrary start value and arbitrary sampling times. Note that four-bit counter 94 could have been integrated into 16-bit counter 96, and if needed, a multiplexer could be used to select a divided frequency.

Figure 6:
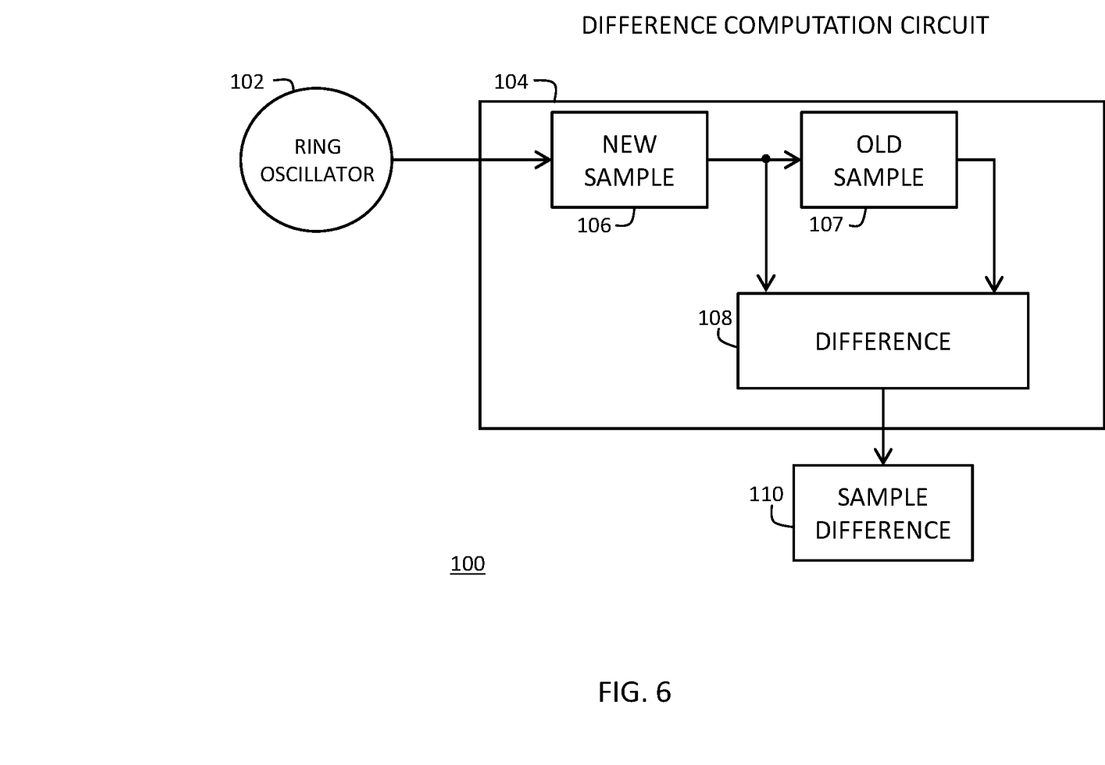
FIG. 6 illustrates a sampling difference computation circuit in accordance with an embodiment.

FIG. 6 illustrates a difference circuit 100 in accordance with an embodiment. Difference circuit 100 is connected to RO 102 and includes shift registers 106 and 107, and difference computation circuit 108. In one embodiment, the difference computation circuit is a barrel-shifter and in another embodiment, the difference computation circuit is a lookup table. The sample difference may be determined using shift registers 106 and 107 and small barrel-shifter 108 that is twice the length of the compressed samples. Barrel-shifter 108 performs the difference computation in accordance with one embodiment. A zero-bit in the right most bit of a shift register indicates that a corresponding RO TRNG (not shown in FIG. 6) is in the first half of a compression cycle. A one-bit in the right most bit of the shift register indicates the RO TRNG (not shown) is in the second half of a compression cycle. The total number of one-bits (Hamming weight) per shift register indicates an absolute offset to an "origin". Therefore, the barrel-shifter can be initialized with 100 . . . ), where the positions indicate the differences 0, 1, 2, . . . and then rotate barrel-shifter 108 bit-by-bit, depending on the bit differences of shift registers 106 and 107 and the original right-most bits in shift registers 106 and 107. If the first shift register 106 had a 0 on the right, barrel-shifter 108 is rotated one bit to the right (+1) for each one bit in shift register 106. If the right most bit in shift register 106 is a 1, barrel-shifter 108 is rotated to the left for each one bit (−1). For the bits in the second shift register 107, the barrel-shifter 108 is rotated in the other direction. So, if the second shift register 107 had a 0 on the right, the barrel-shifter 108 is rotated one bit to the left (−1) for each one bit in shift register 106. If the right most bit on shift register 106 is a 1, barrel-shifter 108 is rotated to the right for each one bit in shift register 106 (+1). At the end, the difference is equal to the first sample (NEW SAMPLE) minus the second sample (OLD SAMPLE) in shifter registers 106 and 107. The sample difference 110 is one-hot encoded in the barrel-shifter and then encoded as a normal binary number. One useful property for this is that the Hamming distance (Hamming weight of XOR) of the two samples provides the absolute difference. Alternatively, the connection between shift registers 106 and 107 may be removed, and the inputs of the shift registers may be connected to the output of the RO 102 using a multiplexer (not shown).

In another embodiment, to compute differences, a simple lookup table may be used as shown below that would include 6×6=36 entries of 3 bits plus a "default table entry" for all invalid samples (the two remaining invalid states). The 3-bit example above would be encoded in the same format and used in place of the barrel-shifter in difference computation circuit 108. The NEW and OLD samples from shift registers 106 and 107, respectively, are fed into the look up table below to output the actual difference in column DIFF.

| NEW | OLD | DIFF |
|-----|-----|------|
| 000 | 000 | 000 |
| 100 | 000 | 100 |
| 110 | 000 | 110 |
| 111 | 000 | 111 |
| 011 | 000 | 011 |
| 001 | 000 | 001 |
| 000 | 100 | 001 |
| 100 | 100 | 000 |
| 110 | 100 | 100 |
| 111 | 100 | 110 |
| 011 | 100 | 111 |
| 001 | 100 | 011 |
| 000 | 110 | 011 |
| 100 | 110 | 001 |
| 110 | 110 | 000 |
| 111 | 110 | 100 |
| 011 | 110 | 110 |
| 001 | 110 | 111 |
| 000 | 111 | 111 |
| 100 | 111 | 011 |
| 110 | 111 | 001 |
| 111 | 111 | 000 |
| 011 | 111 | 100 |
| 001 | 111 | 110 |
| 000 | 011 | 110 |

-continued

| NEW | OLD | DIFF |
|-----|-----|------|
| 100 | 011 | 111 |
| 110 | 011 | 011 |
| 111 | 011 | 001 |
| 011 | 011 | 000 |
| 001 | 011 | 100 |
| 000 | 001 | 100 |
| 100 | 001 | 110 |
| 110 | 001 | 111 |
| 111 | 001 | 011 |
| 011 | 001 | 001 |
| 001 | 001 | 000 |

After calculating the difference, some post-processing or conditioning compresses multiple differences or samples into fewer bits but with higher entropy per bit. Also, some health testing may be done, which may simply involve, for example, checking the distribution of the compressed output.

Figure 7:
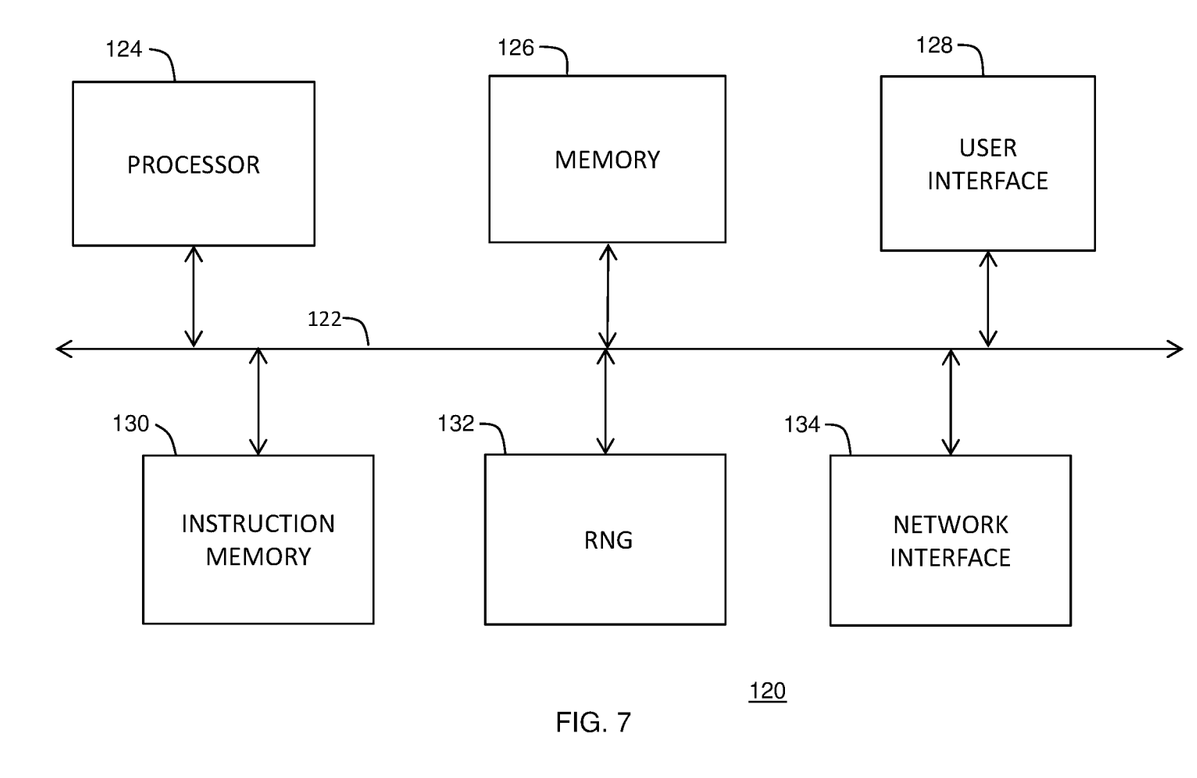
FIG. 7 illustrates a data processing system for use with the disclosed TRNGs.

FIG. 7 illustrates data processing system 120 for use with the disclosed RO based TRNGs. Data processing system 120 may be implemented on one or more integrated circuits and may be used in an implementation of the described TRNG embodiments. Data processing system 120 may be used in applications requiring secure access, such as for example, smartcards or mobile phones. Data processing system 120 includes bus 122. Connected to bus 122 is processor 124, memory 126, user interface 128, instruction memory 130, RNG block 132, and network interface 134. Generally, processor 124 is configured to execute security-sensitive applications. Processor 124 may be any hardware device capable of executing instructions stored in memory 126 or instruction memory 130. For example, processor 124 may execute instructions stored in memory 126 or instruction memory 130 for accessing random numbers from RNG 132. The security-sensitive applications may be encrypted. Processor 124 may have multiple processing cores. Processor 124 may be, for example, a microprocessor, field programmable gate array (FPGA), application-specific integrated circuit (ASIC), or similar device.

An embodiment of random number generator 132, as described above in FIGS. 1-6, can be used to generate random numbers for constructing, for example, one or more asymmetric or symmetric cryptographic keys. The constructed keys may then be used to encrypt the security-sensitive applications and associated data for storage in memory 126. Random number generator 132 may be implemented partially in hardware and partially in firmware on data processing system 120 or a similar data processing system.

Memory 126 is considered a secure memory for storing security-sensitive applications and data. Memory 126 may include volatile memory such as static random-access memory (SRAM) or dynamic RAM (DRAM), or may include non-volatile memory such as flash memory, read only memory (ROM), or other volatile or non-volatile memory. Alternately, memory 126 may be a hard drive implemented externally to data processing system 120. In one embodiment, memory 126 is used to store random numbers generated by RNG 132.

User interface 128 may be connected to one or more devices for enabling communication with a user such as an administrator. Network interface 134 may include one or more devices for enabling communication with other hardware devices. For example, network interface 134 may include, or be coupled to, a network interface card (NIC) configured to communicate according to the Ethernet protocol, or with near field communication (NFC). Also, network interface 134 may implement a TCP/IP stack for communication according to the TCP/IP protocols. Various other hardware or configurations for communicating are available.

Instruction memory 130 may include one or more machine-readable storage media for storing instructions for execution by processor 124. In other embodiments, both memories 126 and 130 may also store data upon which processor 124 may operate. Memories 126 and 130 may store instructions for accessing RNG 132 and data related to RNG 132. Memories 126 and 130 may also store, for example, encryption, decryption, and verification applications or data related to the applications.

By sampling a complete RO-state, a RO based TRNG is provided that is faster than an RO based TRNG that only samples one output state of the RO.

Various embodiments, or portions of the embodiments, may be implemented in hardware or as instructions on a non-transitory machine-readable storage medium including any mechanism for storing information in a form readable by a machine, such as a personal computer, laptop computer, file server, smart phone, or other computing device. The non-transitory machine-readable storage medium may include volatile and non-volatile memories such as read only memory (ROM), random access memory (RAM), magnetic disk storage media, optical storage medium, flash memory, and the like. The non-transitory machine-readable storage medium excludes transitory signals.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A random number generator circuit comprising:
a first ring oscillator having a plurality of series-connected stages coupled together in a ring, wherein an output of a last stage of the first ring oscillator is coupled to an input of a first stage of the first ring oscillator;
a plurality of sampling circuits, a sampling circuit of the plurality of sampling circuits having an input coupled to a node located between two adjacent stages of the plurality of series-connected stages, wherein every node of the first ring oscillator is coupled to a corresponding sampling circuit of the plurality of sampling circuits;
a second ring oscillator having an output; and
a counter having an input coupled to the output of the second ring oscillator, and an output, wherein the second ring oscillator and the counter are for providing a sampling pulse for controlling sampling of the first ring oscillator using the plurality of sampling circuits.

2. The random number generator circuit of claim 1, further comprising a synchronization circuit coupled to an output of each of the plurality of sampling circuits.

3. The random number generator circuit of claim 2, wherein the synchronization circuit comprises:
a first flip-flop having an input, a clock input, and an output;
a second flip-flop having an input coupled to the output of the first flip-flop, a clock input, and an output; and
a logic gate having an input coupled to the output of the second flip-flop.

4. The random number generator circuit of claim 2, wherein the synchronization circuit comprises:
a NOR logic gate having a first input coupled to the node between two adjacent stages, a second input coupled to receive a first clock signal, and an output;
an OR logic gate having a first input coupled to the output of the NOR logic gate, a second input coupled to receive a second clock signal, and an output;
a first NAND logic gate having a first input coupled to the node between two adjacent stages, a second input coupled to receive the first clock signal, and an output;
a second NAND logic gate having a first input coupled to the output of the first NAND logic gate, a second input coupled to receive the second clock signal, and an output;
a first counter having an input coupled to the output of the OR logic gate, and an output; and
a second counter having an input coupled to the output of the second NAND logic gate, and an output.

5. The random number generator circuit of claim 1, wherein each of the plurality of series-connected stages comprises an inversion.

6. The random number generator circuit of claim 1, further comprising a compression circuit for decreasing a number of outputs of the random number generator.

7. The random number generator circuit of claim 1, further comprising:
a first shift register having an input coupled to an output of the first ring oscillator for receiving a first sample, and an output;
a second shift register having an input coupled to the output of the first shift register for receiving a second sample, the second sample previous in time to the first sample, and an output; and
a difference computation circuit having a first input coupled to the output of the first shift register and a second input coupled to the output of the second shift register, and an output for providing a sample difference between the first and second samples.

8. A true random number generator circuit comprising:
a first ring oscillator having a plurality of series-connected stages coupled together in a ring, wherein an output of a last stage of the first ring oscillator is coupled to an input of a first stage of the first ring oscillator;
a plurality of sampling circuits, a sampling circuit of the plurality of sampling circuits having an input coupled to a node located between two adjacent stages of the plurality of series-connected stages, wherein every node of the first ring oscillator is coupled to a corresponding sampling circuit of the plurality of sampling circuits;
a synchronization circuit coupled to an output of each of the plurality of sampling circuits;
a second ring oscillator having an output; and
a counter having an input coupled to the output of the second ring oscillator, and an output, wherein the second ring oscillator and the counter for providing a sampling pulse for controlling sampling of the first ring oscillator using the plurality of sampling circuits.

9. The true random number generator circuit of claim 8, wherein the synchronization circuit comprises:
a first flip-flop having an input, a clock input, and an output;
a second flip-flop having an input coupled to the output of the first flip-flop, a clock input, and an output; and
a logic gate having an input coupled to the output of the second flip-flop.

10. The true random number generator circuit of claim 8, wherein the synchronization circuit comprises:
a NOR logic gate having a first input coupled to the node between two adjacent stages, a second input coupled to receive a first clock signal, and an output;
an OR logic gate having a first input coupled to the output of the NOR logic gate, a second input coupled to receive a second clock signal, and an output;
a first NAND logic gate having a first input coupled to the node between two adjacent stages, a second input coupled to receive the first clock signal, and an output;
a second NAND logic gate having a first input coupled to the output of the first NAND logic gate, a second input coupled to receive the second clock signal, and an output;
a first counter having an input coupled to the output of the OR logic gate, and an output; and
a second counter having an input coupled to the output of the second NAND logic gate, and an output.

11. The true random number generator circuit of claim 8, wherein each of the plurality of series-connected stages comprises an inversion.

12. The true random number generator circuit of claim 8, further comprising a compression circuit for decreasing a number of outputs of the random number generator.

13. The true random number generator circuit of claim 8, further comprising:
a first shift register having an input coupled to an output of the first ring oscillator for receiving a first sample, and an output;
a second shift register having an input coupled to the output of the first shift register for receiving a second sample, the second sample previous in time to the first sample, and an output; and
a difference computation circuit having a first input coupled to the output of the first shift register and a second input coupled to the output of the second shift register, and an output for providing a sample difference between the first and second samples.

14. A method for generating a random number comprising:
providing a first ring oscillator having a plurality of series-connected stages coupled together in a ring, wherein an output of a last stage of the first ring oscillator is coupled to an input of a first stage of the ring oscillator;

sampling, using a plurality of sampling circuits, output signals from the ring oscillator, wherein a sampling circuit of the plurality of sampling circuits having an input coupled to a node located between two adjacent stages of the plurality of series-connected stages, wherein every node of the first ring oscillator is coupled to a corresponding sampling circuit of the plurality of sampling circuits;

providing a second ring oscillator having an output; and providing a counter having an input coupled to the output of the second ring oscillator, and an output, wherein the second ring oscillator and the counter for providing a sampling pulse for controlling sampling of the first ring oscillator using the plurality of sampling circuits.

15. The method of claim 14, further comprising synchronizing the output signals using a synchronization circuit coupled to an output of each of the plurality of sampling circuits.

16. The method of claim 14, wherein each of the plurality of series-connected stages of the first ring oscillator comprises an inversion.

17. The method of claim 14, further comprising compressing the output signals from a first number of output signals to a second number of output signals using a compression circuit.

\* \* \* \* \*